United States Patent [19]

Aboaf et al.

[11] 4,016,017
[45] Apr. 5, 1977

[54] INTEGRATED CIRCUIT ISOLATION STRUCTURE AND METHOD FOR PRODUCING THE ISOLATION STRUCTURE

[75] Inventors: Joseph Adam Aboaf, Peekskill; Robert Wallace Broadie, Hopewell Junction; William Aaron Pliskin, Poughkeepsie, all of N.Y.

[73] Assignee: International Business Machines Corporation, Armonk, N.Y.

[22] Filed: Nov. 28, 1975

[21] Appl. No.: 636,243

[52] U.S. Cl. .............................. 148/187; 148/1.5; 204/129
[51] Int. Cl.$^2$ ...................................... H01L 21/316
[58] Field of Search ................... 148/1.5, 186, 187; 204/129

[56] References Cited

UNITED STATES PATENTS 3,640,806  2/1972  Watanabe et al. ................ 204/143
3,919,060  11/1975  Pogge et al. .................... 204/129.3

Primary Examiner—G. Ozaki
Assistant Examiner—J. M. Davis
Attorney, Agent, or Firm—George O. Saile

[57] ABSTRACT

A semiconductor device, such as a transistor, integrated circuit or the like, having a pattern of oxidized and densified porous silicon regions extending onto one of its major surfaces for isolating regions of the semiconductor is manufacturable by a relatively simple process. The process involves forming porous silicon regions in the surface of the semiconductor body such as a silicon wafer, in the areas where dielectric isolation between semiconductor devices is desired. The porous silicon regions are then oxidized at a temperature sufficient to completely oxidize the porous silicon. The oxidation is such that the oxidized porous silicon extends above the surface of the semiconductor wafer. The oxidized porous silicon regions are then subjected to a temperature higher than the oxidizing temperature utilized in the previous step to cause the densification of the oxidized porous silicon regions. The result of this densification step is the collapse of the porous oxide to a dense structure which is substantially planar with the surface of the semiconductor wafer. This densified silicon dioxide structure has an etch rate which is substantially the same as thermally grown silicon dioxide.

13 Claims, 16 Drawing Figures

INTEGRATED CIRCUIT ISOLATION STRUCTURE AND METHOD FOR PRODUCING THE ISOLATION STRUCTURE

BACKGROUND OF THE INVENTION

The invention relates to semiconductor device and to methods for producing such devices. More particularly, the invention involves methods and resulting structures for isolating regions of a semiconductor body from other regions of a semiconductor body.

DESCRIPTION OF THE PRIOR ART

Semiconductor devices often require various active and passive devices within its structure to be electrically isolated from one another. Various structures have been used to provide isolation. Of the types of isolation structures utilized, air isolation, junction isolation and dielectric isolation have been the most widely used.

The isolation structure known in the art as dielectric isolation involves such materials as silicon dioxide, glass, silicon nitride, and so forth which are formed or deposited in regions of a semiconductor substrate so as to isolate portions of the semiconductor from other portions of the semiconductor so that subsequently semiconductor devices such as bipolar transistors, Schottky barrier diodes, MOSFET devices, etc., can be formed within the semiconductor regions from one another.

There have been various techniques for forming the dielectric material in the semiconductor substrate. One technique for forming recessed oxide dielectric regions involves the formation, as an initial step, of porous silicon regions through an anodization process. This technique is described in U.S. Pat. No. 3,640,806 to Y. Watanabe et al. and H. B. Pogge et al. patent application, Ser. No. 479,321, now U.S. Pat. No. 3,919,060, being assigned to the assignee of the present invention. The process generally consists of masking a silicon substrate in the regions which ultimately will contain the semiconductor devices, anodizing the unmasked portions of the substrate to form porous silicon regions in the areas which will subsequently contain the dielectric isolation, and exposing the substrate to an oxidizing atmosphere to oxidize the porous silicon material. The value of the process has been limited because of the quality of the silicon dioxide isolation formed by the process. The problem being that the density of the silicon dioxide isolation regions is not sufficient to provide nearly as good an electrical isolation between silicon devices as in prior art processes which involve the conventional thermally grown silicon dioxide isolation regions.

SUMMARY OF THE INVENTION

In accordance with the present invention, the density of the isolation regions in a semiconductor device is substantially increased to where the regions formed from porous silicon is substantially the same as isolation regions made by thermally growing silicon dioxide. The method involves forming porous silicon regions in the semiconductor body. Then oxidizing the porous silicon regions at a temperature sufficient to completely oxidize the porous silicon regions. The result is that the oxidized porous silicon extends above the surface of the semiconductor body. The structure is then subjected to a temperature higher than the oxidizing temperature to cause the densification of the oxidized porous silicon regions. The portion of the oxidized silicon which extended above the surface of the semiconductor body collapses to approximately the same level as the surface of the semiconductor body. The isolation regions at this point are substantially identical in density characteristics and electrical isolation characteristics to that of a thermally grown silicon dioxide region by conventional methods.

DESCRIPTION OF THE PREFERRED EMBODIMENTS

Referring now to FIGS. 1 through 6, there is depicted a preferred embodiment of the method of this invention wherein monocrystalline silicon regions of a substrate are completely surrounded by silicon oxide in the final structure. However, for simplicity a cross-section of a single silicon dioxide pocket is shown.

Figure 1:
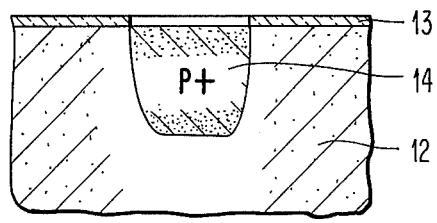
FIGS. 1 through 3 illustrate the first steps of the process for forming an oxidized porous silicon body.

As shown in FIG. 1, a masking layer 13 is deposited or formed on the surface of substrate 12. The masking layer 13 can be silicon dioxide formed by thermal oxidation, pyrolytic deposition, or alternatively, be formed of a composite combination, as for example silicon dioxide with an overlying layer of silicon nitride, or other layer combinations thereof. A suitable photoresist layer (not shown) is subsequently deposited on masking layer 13 and then the photoresist is exposed and developed to form the desired pattern for the subsequent diffusion step. The pattern in the photoresist corresponds to the desired surface configuration of the vertical portions of the ultimate total oxide regions desired in the semiconductor device. The exposed portions of the masking layer 13 are etched using a suitable etchant, and the resist layer removed. Higher conductivity region 14 is then formed by diffusing or ion implanting P+-type impurity through the openings in masking layer 13.

Figure 2:
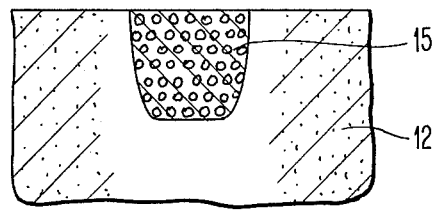

The high conductivity region 14 is then anodized in a solution which converts the silicon in the regions to a porous silicon structure. This can be conveniently achieved by anodizing the structure in an aqueous HF solution at a current density sufficient to achieve porosity. In general, the anodizing solution should contain HF in an amount greater than 10 percent, more particularly from 12 to 25 percent. The most desirable solution concentration for a specific application will depend on device configuration, dopant concentration, solution temperature, current density, illumination, etc. After the anodization step, the resulting structure as illustrated in FIG. 2 is complete, the average porosity of the porous silicon should be greater than 40 percent, more preferably in the range of 45 to 80 percent. Most preferably, the porosity is less than about 60 percent. The exact porosity of the silicon can be adjusted by varying the HF concentration of the anodizing solution, the illumination, the temperature of the solution, the dopant concentration of the silicon regions, and the current density. If the silicon porosity is significantly greater than 60 percent (for example, 85 percent), a treatment of 970° C in steam followed by 1200° C for 15 minutes steam would lead to a non-completely densified oxide. If the silicon porosity is significantly less than about 45 percent, a non-complete oxidation occurs even if complete densification occurs. The current density for ordinary, practical conditions is in the range of 1 to 60 milliamperes per square cm.

In utilizing the structure illustrated in FIGS. 1 through 6, a silicon oxide masking layer 13 can be used. In the anodizing process, the masking layer 13 will be etched away. In the illustrated method embodiment, no masking layer is required during the anodizing step since the P+ region 14 is preferentially anodized. If a material such as silicon nitride is used as a diffusion mask 13 that is resistant to an HF solution, the material will remain during anodization. This type of masking layer is desirable when the conductivity types of the substrate are reversed, i.e., N+ annular regions surrounding P-type monocrystalline device regions.

The porous silicon region 15 is oxidized in an oxidizing environment, typically in $O_2$ or steam, at elevated temperatures, such as above about 970° C. The porous region 15 will oxidize very rapidly, compared to monocrystalline silicon. During the oxidization, the surface of the substrate 12 is oxidized to form a silicon dioxide layer 17. The usual oxidation masking layer, typically $Si_3N_4$, is not necessary because the steam or $O_2$ penetrates the porous silicon regions.

Figure 3:
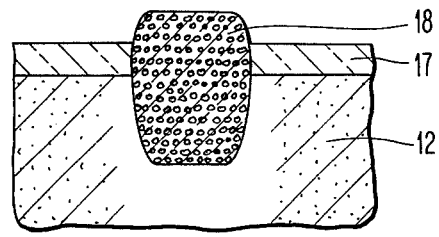
Figure 4:
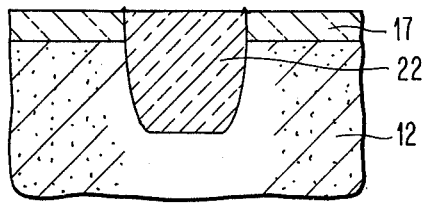
FIG. 4 shows the resulting isolation structure of one form of the invention.

The oxidation of the porous silicon regions is then accomplished at a temperature sufficient to completely oxidize the porous silicon regions so that the oxidized porous silicon extends above the surface of the body such as shown in the resulting structure of FIG. 3. The porous silicon 15 is converted to silicon dioxide region 18.

Figure 5:
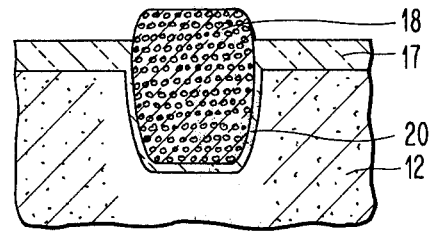
FIGS. 5 and 6 illustrate the intermediate step and resulting structure respectively in a second embodiment of the present invention.
Figure 6:
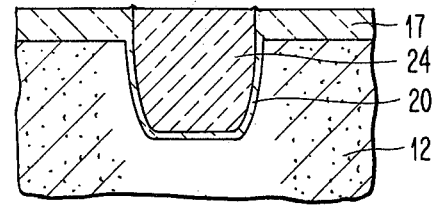

Oxidation can be continued beyond where the porous silicon is turned completely into silicon dioxide. This further time period of subjection to the oxidation conditions would result in a growth of a thermal oxide layer 20 under the oxidized porous silicon regions 18. This is shown in the embodiment of FIGS. 5 and 6. The oxidized silicon region 18 is now silicon dioxide. However, the characteristics of the silicon dioxide is such that it is not as good as dielectric as thermally grown silicon dioxide. This characteristic can be characterized by the etching rate of the silicon dioxide. The etching rate at this point is of the order of 300 percent higher than thermally grown silicon dioxide.

The improvement in the dielectric characteristics of the porous silicon dioxide region is made by the final step of the present method which is subjecting the oxidized porous silicon regions to a temperature higher than the oxidizing temperature to cause a densification of the oxidized porous silicon regions. The result of this densification step is the collapsing and densification of the region 18 into the region 22 of FIG. 4 and the region 24 of FIG. 6. The proper choice of the porosity of the porous silicon regions 15 produce a densified isolation region 22 or 24 which is substantially planar with the surface of the semiconductor body. The etch rate of the densified and collapsed regions 22 and 24 are now comparable to that of thermally grown silicon dioxide and therefore, the dielectric characteristics of these resulting regions is equivalent thereto.

The densification step can be accomplished in nitrogen or other suitable inert atmosphere. Densification can also be accomplished in an oxidizing ambient such as steam, but thermal oxide will also grow on all unmasked silicon regions and even under silicon dioxide masking layers to some extent. However, steam is an efficient densifier where the porosity is high. The resulting characteristics of the densified silicon dioxide is depended upon annealing time, temperature and porosity of the original silicon region 15.

Densification will increase as a function of time and temperature. At 1150° C, 2 hours are required to densify the porous silicon oxide. At 1200° C, a 15-minute time period is enough to accomplish densification. At 1100° C, a 3- to 4-hour time period is necessary, while at 1000° C, densification is practically impossible.

The more porous silicon, e.g., 65%, will require a longer densification time than, e.g., 56% porous silicon. For 56% porous silicon, a 1- to 15-minute time period at 1200° C is enough for completing the step. For 65%, more than 1 hour is necessary for densification at 1200° C. A 1- to 5-minute steam densification is adequate for 1200° C. However, at least 1 to 2 hours at 1150° C is required.

The porous silicon consists of pores perpendicular to the surface, having four sides, each about 100A in length and the intrapore silicon spacing is also about 100A. The size, number of these pores, and the intrapore silicon spacing depends on the anodic conditions used for the formation of the pores and the porosity of the layers.

This silicon mesh structure when oxidized forms essentially the same type of structure, with smaller size pores. The thickness of the porous silicon layer increases upon oxidation because the silicon does not expand completely into the pore volume. This is what is found for P+-type porous layers and to a smaller extent for P+ diffused pokets. The difference between these is probably due to the number, size of pores and silicon intrapore spacing.

The porous silicon oxide mesh structure has a higher etch rate than the usual thermal grown silicon oxides. The high etch rate of the top part of the oxide obtained at 970° C could be due to the fact that the layer is more porous at the top than at the bottom. This is the result of the gradient in concentration in P+ diffused layers. Larger pores at the surface are obtained for very high concentrations of boron dopant in diffused layers. It is also possible that a partial collapse occurs at the bottom of a pocket during oxidation.

Higher temperature steam oxidations, such as 1200° C, of less porous layers is incomplete. It appears that the collapse of the top structure occurs relatively fast and that the oxidation species do not have the possibility of completely diffusing through to the bottom porous layers. It is also possible, because of the mesh structure of porous silicon, that the high temperature could collapse the bottom portions of the porous silicon to some extent.

The densification occurring at high temperature can be explained if one considers the very fine texture of the oxide and its possible deformation. In the region between the anneaing point of a glass, that is, temperature at which stress is substantially relieved, and its softening point, that is, temperature at which the glass deforms very rapidly and adheres to other bodies, distortion occurs. For fused silica, these temperatures are respectively 1100° and 1500° C. For a porous texture, deformation at 1200°C could occur. The porous oxide will have a tendency to flow more easily than a thick glass layer and at a lower temperature. This tendency to flow is dependent on temperature and on time. It will also be dependent on the initial porosity, size and number of pores. A more porous oxide texture with larger pores will necessitate longer times at higher temperatures for complete densification.

Figure 7:
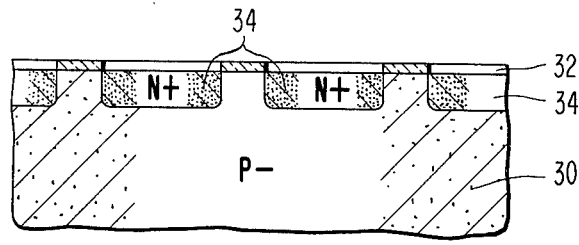
FIGS. 7 and 8 illustrate steps in forming bipolar integrated circuits using the technique of the present invention.

Referring now to FIGS. 7 through 10, there is shown other preferred embodiments of the method of this invention. As indicated in FIG. 7, silicon substrate 30 is masked with layer 32 and a diffusion made forming high conductivity N-type doped regions 34. The masking layer 32 is removed and an epitaxial silicon layer 36 deposited on the top surface of substrate 30 to form the structure of FIG. 8. It is noted that the N+ regions 34 outdiffused into the epitaxial layer to form subcollector regions 37.

Figure 9A:
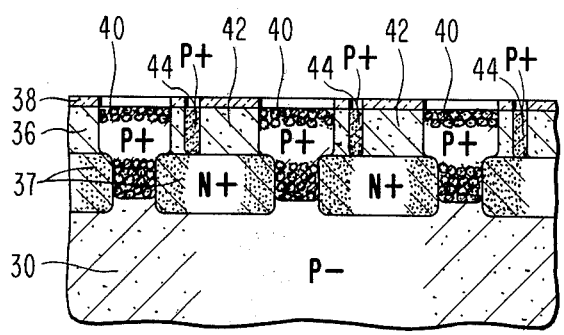
FIGS. 9A, B, C and D illustrate the formation of integrated circuits by one embodiment of the present invention.
Figure 9C:
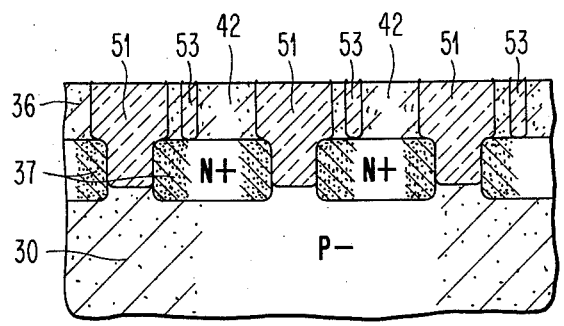
Figure 9D:
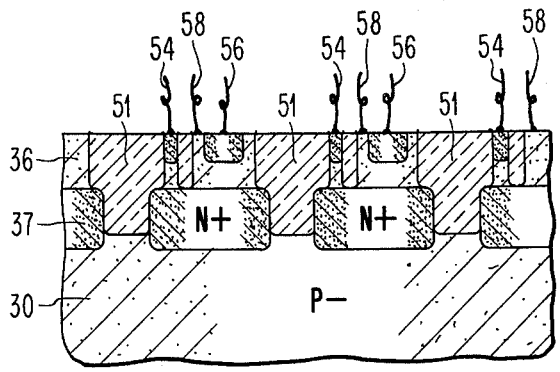
Figure 10D:
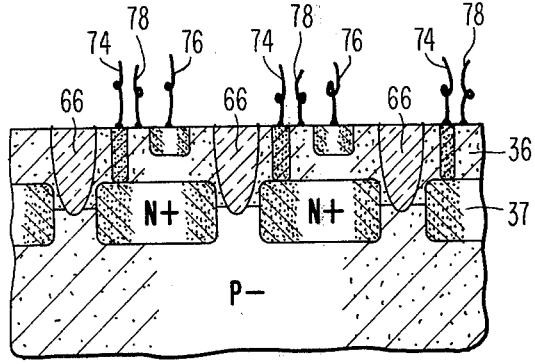

As indicated in FIG. 9A, a masking layer 38 is deposited on the surface of epitaxial layer 36 and a pattern etched therein using conventional photolithographic and etching techniques to define a grid of openings that will overlie the ultimate desired recessed oxide regions. A conventional diffusion or ion implantation step results in a grid of high conductivity P-type regions (not shown) that surround monocrystalline regions of the epitaxial layer 36. In the specific embodiment, the monocrystalline silicon N-type region 42 surrounded by P-type region 40, and is divided into two portions by an intermediate P-type region 44. Region 44 extends to the high conductivity region 37. Regions 40 extend down to the interface between the epitaxial layer 36 and substrate 30 or to a generally laterally extending PN junction. If desired, regions 40 can extend into the structure to contact the PN junction surrounding region 34. The resultant substrate is then exposed to an anodizing step, described previously in relation to FIG. 2 wherein the silicon of regions 40 and 44 are converted to porous silicon, preferably having a porosity of less than about 60 percent. The resulting structure is shown in FIG. 9A. The porous silicon regions 40 surround the monocrystalline pockets of the epitaxial layer above high conductivity N-type region 34 while intermediate porous silicon region 44 separates the surrounded pocket into two regions. The porous silicon in regions 40 and 44 is then oxidized to form corresponding oxide regions 50 and 52 to produce the FIG. 9B structure. The oxidation is similar to that described in relation to FIG. 3. Afterward, the densification step is accomplished as described above with reference to FIGS. 4 and 6 to produce the FIG. 9C structure wherein the densified silicon dioxide is areas 51 and 53. Various types of semiconductor devices, both active and passive can now be formed by any suitable semiconductor processing technique into the isolated pockets of monocrystalline epitaxial layer 36. As indicated in FIG. 9D, transistors can be formed wherein a collector contact 54 is formed in one of the regions. Emitter and base regions 56 and 58, respectively, are fabricated by diffusion or ion implantation techniques. The transistor can be passivated using conventional well-known passivation techniques and interconnection metallurgy systems to interconnect the transistors and other devices into operative circuit elements.

Figure 8:
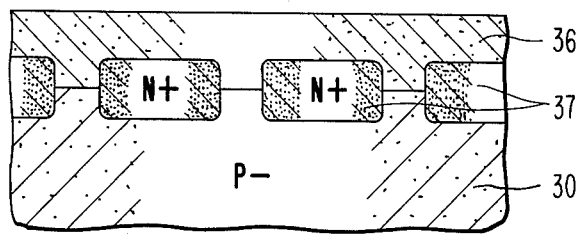
Figure 10A:
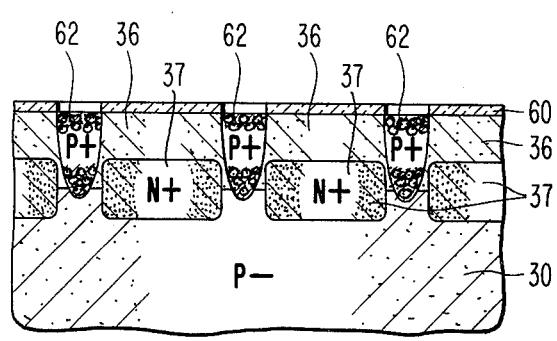
FIGS. 10A, B, C and D illustrate the formation of integrated circuits of a second form of the present invention.
Figure 9B:
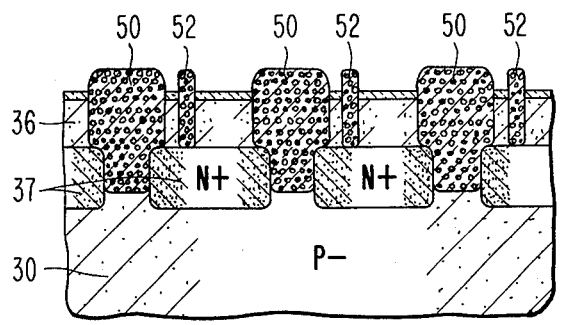
Figure 10B:
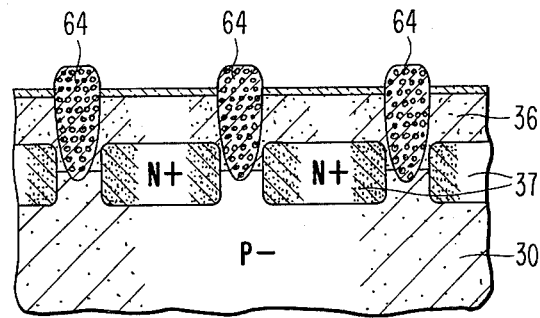
Figure 10C:
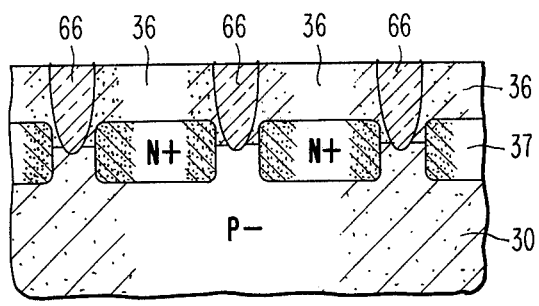

In FIGS. 10A–D, there is depicted another preferred embodiment of the method of this invention which uses FIG. 8 as its starting point. As shown in FIG. 10A, a masking layer 60 is deposited on the surface of epitaxial layer 36 and a pattern etched therein using conventional photolithographic and etching techniques to define a grid of openings that will overlie the ultimate desired recessed oxide regions. A conventional diffusion or ion implantation step results in a grid of high conductivity P-type regions (not shown) that surround monocrystalline regions of the epitaxial layer 36. The P-type regions extend down to the interface between the epitaxial layer 36 and substrate 30 or to a generally laterally extending PN junction. The resultant substrate is then exposed to an anodizing step, described previously in relation to FIG. 2 wherein the silicon of P-type region is converted to porous silicon. The porous silicon regions 62 surround the monocrystalline pockets of the epitaxial layer above high conductivity N-type region 37. The porous silicon in region 62 is then oxidized to form oxide region 64 as shown in FIG. 10B wherein the silicon dioxide extends about the surface. The collapse and densification step is accomplished resulting in the FIG. 10C wherein the densified region is 66. Transistors were formed in the pockets separated by regions 66 wherein a collector contact 74 is formed in one of the regions. Emitter and base regions 76 and 78, respectively, are fabricated by diffusion or ion implantation techniques. The transistor can then be passivated and interconnection metallurgy systems applied to interconnect the transistors and other devices into operative circuit elements.

The following examples are included merely to aid in the understanding of the invention and variations may be made by one skilled in the art without departing from the spirit and scope of the invention.

EXAMPLES 1–4

Porous silicon was formed in a P+-type (0.01 ohm cm) silicon wafer in an electrochemical cell using the silicon wafer as anode and a platinum strip as cathode. The conditions were varied as given in Table I to produce the structures of Table I for Examples 1–4.

TABLE I

| | | | | Conditions | | |
|---|---|---|---|---|---|---|
| Example | Thickness | Index | Porosity | Solution | Current Density | Time |
| 1 | 1.728 | 1.471 | 84.7 | HF 10% | 60ma/cm$^2$ | 1 min. |
| 2 | 2.070 | 2.147 | 62.7 | HF 16% | 60ma/cm$^2$ | 45 sec. |
| 3 | 1.867 | 2.240 | 59.7 | HF 20% | 60ma/cm$^2$ | 35 sec. |
| 4 | 1.929 | 2.673 | 45.6 | HF 25% | 60ma/cm$^2$ | 30 sec. |

In the Tables, thickness is in microns, index of refraction at 5461 A and porosity in percent of voids in the porous silicon layers on P+-type wafers for various conditions as measured by the VAMFO described in IBM Journal 8, 43 (1964) and using the relation, porosity = 100(1-DF) where DF is $(n_{ps}-1)/(n_s-1)$ where $n_{ps}$ is the refractive index of the porous silicon film and $n_s$ the refractive index of silicon. This method has been described in the paper associated with abstract 442RNP by W. A. Pliskin and J. A. Aboaf, *J. Electrochemical Society* 122, 182C (1975). The wafer was cut in four quarters.

The first quarter of the wafer is then oxidized at 970° C steam in a furnace for 10 minutes to produce the structures in TABLE II.

TABLE II

| Example | Thickness | Index | Porosity |
|---|---|---|---|
| 1 | 1.719 | 1.222 | 51.7 |
| 2 | 2.600 | 1.350 | 24.0 |
| 3 | 2.287 | 1.385 | 16.3 |
| 4 | 2.676 | 1.439 | 4.5 |

The second quarter of the wafer was sequentially oxidized at 970° C in steam for 10 minutes and then densified in steam at 1200° C for 15 minutes to produce the structures of TABLE III.

TABLE III

| Example | Thickness | Index | Porosity |
|---|---|---|---|
| 1 | 1.446 | 1.381 | 17.1 |
| 2 | 2.158 | 1.462 | 0 |
| 3 | 1.944 | 1.463 | 0 |
| 4 | 2.574 | 1.458 | 0.6 |

In general, porous silicon layers were completely oxidized. Except in a few cases, the refractive index of the oxide is less than 1.461, the refractive index of thick thermal oxide. The oxidation of layers of various porosities in 970° C steam results in a large increase in volume for the less porous samples: 39 and 22%, respectively for initial silicon porosities of 46 and 60%. The oxidation of porous silicon at 970° C results in porous oxide for all porosities of silicon investigated. The porous silicon upon oxidation at 970° C expands in the Z-direction.

Samples oxidized in 970° C steam, followed by a 1200° C steam treatment resulted in complete densification for all samples except for the case of the more porous sample. The less porous sample which was not completely oxidized during the 1200° C steam oxidation (see below) is now completely oxidized with an index of refraction of 1.458.

The third quarter of the wafer was oxidized in 1200° C steam in a furnace for 15 minutes without any previous 970° C oxidation. The resulting structures are given in TABLE IV.

TABLE IV

| Example | Thickness | Index | Porosity |
|---|---|---|---|
| 1 | 1.310 | 1.419 | 9.0 |
| 2 | 2.066 | 1.461 | 0 |
| 3 | 1.966 | 1.455 | 1.0 |
| 4 | 2.449 | 1.479 | Not Completely Oxidized |

The etch rate of these samples except for the more porous sample is the same as thermal oxide. However, this process, one-step oxidation, will grow a very thick layer on the non-porous silicon, which in device manufacturing is usually not wanted.

The oxidation of porous silicon in 1200° C steam resulted in a porous oxide for more porous silicon, 84.7%, a dense oxide for 59.7 and 62.7% porous silicon (index of refraction equal to that of thermal oxide and not completely oxidized silicon for the less porous silicon 46.5% Example).

EXAMPLES 5-6

A P-type silicon wafer having a 2-micron thick N-type epitaxial layer was thermally oxidized in steam at a temperature of 970° C to form a masking silicon dioxide layer thereover. Photoresist was applied thereto, exposed through a mask, developed and the silicon dioxide was etched away in the areas where the P+ diffusion was to be made. The diffused area covered about 30% of the total wafer surface. A boron diffusion was made by capsule diffusion to produce a P+ surface concentration of $10^{20}$ atoms/cc. This was a boron capsule diffusion at 1100° C, for 50 minutes, $Co=3.6 \times 10^{20}$.

Porous silicon was then preferentially formed in the wafer in an electrochemical cell using the silicon wafer as anode and a platinum strip as cathode. The conditions are indicated in Table V.

TABLE V

| Example | Conditions Solution | Current Density | Thickness in Microns | Porosity Weight % |
|---|---|---|---|---|
| 5 | HF 50% | 5ma/cm² | 1.75 | 56% |
| 6 | HF 25% | 5ma/cm² | 2.1 | 65% |

The wafers were then oxidized at 970° C in steam in a furnace for 10 minutes to produce porous silicon dioxide. The P+ diffused porous pockets upon oxidation expand in the Z-direction and the etch rate was as given in Table VI:

TABLE VI

| Example | Expansion | Etch Rate |
|---|---|---|
| 5 | 3400 A | 2µ/min |
| 6 | 1300 A | 3µ/min |

The samples were oxidized in 970° C steam followed by a 1200° C steam treatment at 10 min. in nitrogen resulting in the structure of Table VII.

TABLE VII

| Example | Expansion | Etch Rate |
|---|---|---|
| 5 | 600 A | 250 A/min |
| 6 | (−4000 A) contraction | 2 µ/min |

The etch rate of the 56% porous silicon was after the densification step the same as that of thermal oxide (solution used 1 HF to 10 parts water).

The samples oxidized in 1200° C steam for 5 min. had the characteristics given in Table VIII.

TABLE VIII

| Example | Expansion | Etch Rate |
|---|---|---|
| 5 | 400 A | 250 A/min |
| 6 | (−2000 A) contraction | 0.6 µ/min |

The oxidation in 1200° C steam of the 65% porous sample occurred down to the bottom of the porous pocket; this did not happen for the 56% porous sample. In the case of the 65% porous sample, the depth of the pocket after completely etching the oxide is the same for both oxidation temperatures, but for the 56% porous sample the pocket for the 1200° C oxidation was not as deep as that for the 970° C. The etch rate of the oxidized 65% porous silicon is about three times that of thermal oxide. That of the 56% sample is the same as thermal oxide.

EXAMPLES 7–11

The process of Examples 5 was repeated through the oxidation of the porous silicon step. The conditions in making the porous silicon were HF 50%, current density 5 ma/cm$^2$ so as to make 55 weight percent porous silicon. Example 5 was the standard. Examples 7–11 were densified in a nitrogen atmosphere for the temperature and time indicated in Table V. The etch rate for the resulting silicon dioxide was taken and recorded in Table IX.

TABLE IX

| Example | Temp. in ° C. | Time in Min. | Etch Rate % Higher than Thermal SiO$_2$ |
|---|---|---|---|
| 5 | — | — | 230 |
| 7 | 1100 | 60 | 135 |
| 8 | 1150 | 30 | 75 |
| 9 | 1150 | 60 | 50 |
| 10 | 1200 | 5 | 0–5% |
| 11 | 1200 | 15 | equal |

The etch rate was determined by measuring the thickness removed as a function of time using a solution of HF: 9 H$_2$O).

The results of Table IX are self-explanatory in that about 1200° C temperature is necessary to densify 55% porous silicon to closely equal thermally grown silicon dioxide.

While the invention has been particularly shown and described with reference to the preferred embodiments thereof, it will be understood by those skilled in the art that various changes in form and details may be made therein without departing from the spirit and scope of the invention.

What is claimed is:

1. A method of producing a semiconductor device comprising:
    forming porous silicon regions in a semiconductor body;
    oxidizing said porous silicon regions at a temperature sufficient to completely oxidize said porous silicon regions and so that the oxidized porous silicon extends above the surface of the said body; and
    subjecting the said oxidized porous silicon regions to a temperature higher than said oxidizing temperature to cause the densification of said oxidized porous silicon regions which result in their being substantially planar with the surface of the semiconductor body.

2. The method of claim 1 wherein the said oxidizing temperature is above about 970° C.

3. The method of claim 1 wherein the said semiconductor is silicon.

4. The method of claim 1 wherein said temperature to cause densification is greater than about 1150° C.

5. The method of claim 4 wherein the said densification is accomplished in an inert atmosphere.

6. The method of claim 1 wherein said porous regions were made porous by anodic treatment in a solution of hydrofluoric acid.

7. The method of claim 1 wherein the said porous silicon regions and subjected to said oxidizing temperature long enough to grow a thermal oxide layer under the oxidized porous silicon regions.

8. The method of claim 7 wherein a junction is formed in a semiconductor region adjacent to one of said regions which junction abuts said thermal oxide layer.

9. The method of claim 1 wherein said porous silicon regions have a porosity of less than about 60%.

10. A method of producing integrated circuit devices comprising:
    forming a pattern of porous silicon regions where dielectric isolation between semiconductor devices is desired in a silicon wafer;
    oxidizing said porous silicon regions at a temperature sufficient to completely oxidize said porous silicon regions and so that the oxidized porous silicon extends above the surface of the said wafer;
    subjecting the said oxidized porous silicon regions to a temperature higher than said oxidizing temperature to cause the densification of said oxidized porous silicon regions which result in their being substantially planar with the surface of the said silicon wafer;
    forming said semiconductor devices in portions of said wafer between said densified oxidized porous regions and electrically connecting said semiconductor devices into the desired said integrated circuit devices.

11. The method of claim 10 wherein the porosity of said porous silicon regions is less than about 60%, said oxidizing temperature is above about 970° C., and said temperature to cause densification is greater than about 1150° C.

12. The method of claim 10 wherein the said porous silicon regions are subjected to said oxidizing temperature long enough to grow a thermal oxide layer under the oxidized porous silicon regions.

13. The method of claim 12 wherein certain junctions formed as part of said semiconductor devices abut said thermal oxide layer under the oxidized porous silicon regions.

* * * * *